United States Patent [19]
Babcock et al.

[11] 4,127,438
[45] Nov. 28, 1978

[54] ADHESION PROMOTER FOR ADDITIVELY PLATED PRINTED CIRCUIT BOARDS

[75] Inventors: Thomas C. Babcock, Endicott; Theron L. Ellis, Vestal; Henry C. Majka, Endwell, all of N.Y.

[73] Assignee: International Business Machines Corporation, Armonk, N.Y.

[21] Appl. No.: 848,965

[22] Filed: Nov. 7, 1977

[51] Int. Cl.$^2$ .................... C23F 1/00; C03C 23/00; C23G 1/00
[52] U.S. Cl. .................................. 156/666; 134/29; 134/41; 156/629; 156/901; 427/309
[58] Field of Search ............... 134/2, 3, 19, 28, 29, 134/30, 41 X; 427/96, 309; 252/79.1, 79.2; 156/629, 634, 666, 901, 902, 307; 29/625

[56] References Cited
U.S. PATENT DOCUMENTS

| 2,963,538 | 12/1960 | Dahlgren | 427/96 X |
| 3,020,175 | 2/1962 | Penczek et al. | 427/96 |
| 3,562,039 | 2/1971 | Strohmayer et al. | 134/41 X |
| 3,837,929 | 9/1974 | Cauk | 156/629 X |

Primary Examiner—William A. Powell
Attorney, Agent, or Firm—Cyril A. Krenzer

[57] ABSTRACT

Subsequent to the additive plating of copper circuitry on a substrate and prior to further steps such as lamination to form a multilayer printed circuit board, a sequence of etching and cleaning steps are used to improve the lamination strength of the additively plated copper. The circuitized substrate is dipped in an etchant bath and then baked at an elevated temperature for 2–4 hours. Following this the circuitized substrate is washed with an organic cleaner, water rinsed and air dried. Thereafter a chlorite oxide layer is added to the circuitized substrate and it is ready for further processing.

11 Claims, No Drawings

ADHESION PROMOTER FOR ADDITIVELY PLATED PRINTED CIRCUIT BOARDS

REFERENCE TO RELATED APPLICATION

Reference is made herein to copending application, Ser. No. 848,955, filed Nov. 7, 1977, which is a continuation-in-part of application Ser. No. 651,092, filed Jan. 21, 1976, now abandoned, entitled "Method of Manufacturing Printed Circuit Boards" and assigned to the assignee of the present application.

BACKGROUND OF THE INVENTION

Field of the Invention

In the process of forming multilayer printed circuit boards, it is known that the bond of the prepreg substrate to the copper for the internal layers is improved when an oxide is provided on the copper surface prior to lamination. When making printed circuit boards using the substractive process, wherein an electrodeposited foil copper is first laminated to the substrate, this oxide on the copper surface is provided prior to the lamination of the copper foil to the substrate. Then, after the etching of the printed circuit lines using conventional substractive processes, the remaining copper surface is already oxidized and is easily bonded to the additional prepreg layer of the printed circuit board.

However, when additive copper is used, these bonds cannot be as easily achieved, since the wetting process of the additive copper plating prior to the application of an oxide opens up the surface of the additive copper. This tends to weaken the bond between the oxide and the copper such that when lamination occurs at elevated temperatures, the oxide-to-copper bond breaks, causing very low bond strengths. This problem becomes much more critical as the internal circuit lines become thinner and finer, resulting in circuit discontinuities and other attendant problems.

OBJECTS AND SUMMARY OF THE INVENTION

Accordingly, it is a principal object of this invention to provide an improved process for promoting the adhesion of additively plated copper circuit lines in the internal layers of a multilayer printed circuit board.

A more specific object of the invention is to provide an improved process for cleaning the surface of additively plated copper on a printed circuit board interplane to provide improved adhesion between an oxide and the copper surface.

Still another object of the invention is to provide an improved process for promoting adhesion between interplane copper circuit lines and subsequently applied printed circuit board prepreg surfaces which have improved resistances to the stresses occurring during lamination.

The foregoing and other objects and advantages are accomplished according to one aspect of the invention, wherein subsequent to the additive plating of the printed circuit lines on a substrate, the assembly is dipped in a sodium persulfate solution at the end of an immersion tin process, the assembly is subjected to a high temperature bake to drive out any water and organic entrapments near or on the copper surface, and the assembly is cleaned using an organic cleaner to remove any organic residues brought to the copper surface. Thereafter, a suitable oxide layer is applied to the copper circuit lines, such as for example, a chlorite oxide layer.

DESCRIPTION OF THE PREFERRED EMBODIMENT

The foregoing and other objects and advantages of the invention will become more readily apparent from the following detailed description of the preferred embodiment. In the course of forming the inner planar circuitry for the multilayer printed circuit board, the circuits are additively plated in conventional manner. Such a process is described in copending application Ser. No. 848,955, filed Nov. 7, 1977, which is a continuation-in-part of application Ser. No. 651,092 filed Jan. 21, 1976. Once these circuit lines are defined and additively plated, they can be subjected to a well known immersion tin treatment to protect the circuit pattern during subsequent processing. After this processing, the board is placed in a sodium persulfate dip, the time of the board being in the dip controlled so that the circuit lines are not over-etched, but that the copper surfaces are etched and cleaned enough to improve the subsequent interlaminate adhesion. The persulfate dip also etches minute openings in the copper surface. Depending on the particular application other surface etchants, such as cupric chloride and ferric chloride, may be used.

Following the dip of the board in the sodium persulfate solution, the board is baked at an elevated temperature to drive out the water and other organic entrapments near or on the copper surface. For example, the bake can occur at a temperature of between 135° C. and 170° C. for between two and four hours. The bake can occur at atmospheric pressure or may be carried out in a vacuum.

The baking process causes vaporization of contaminants. This leaves less residue on the copper surface to be bonded. In addition, other contaminants are driven to the surface of the copper by the bake process. Accordingly, the final step is to remove the organic residues brought to the surface of the copper and is a cleaning step prior to the application, for example, of the chlorite oxide layer to the printed circuit pattern.

The sodium persulfate solution may contain between thirty and one hundred twenty grams of sodium persulfate per liter, depending on the dip time. A preferred concentration of about 30 grams per liter for the sodium persulfate dip solution is used for a one minute dip. For the final cleaning step, any suitable organic cleaning solution which will not damage the copper surface can be used. Examples of such organic cleaners are: a product sold under the trade name A-150 manufactured by Enthone Corporation; and a product sold under the trade name PR-491 manufactured by the Allied Coating Division of Whittaker Corp.

The A-150 cleaner contains about 15% potassium hydroxide, 15% propylene glycol and 55% methyl carbitol with the balance being water. The PR-491 cleaner contains about 49% methylene chloride and 35% wetting agents with lesser amounts of oxalic acid and methanol.

EXAMPLE I

After circuitizing a board in the manner similar to that described in the referenced copending application, the board was placed in a sodium persulfate solution for 1 minute, the solution containing 30 grams per liter of sodium persulfate. The board was then baked at atmospheric pressure in an oven at 135° C. ± 5° C. for about two hours. The board was next agitated in an A-150 cleaner solution at about 80° C. for about 2 minutes ± 10 seconds, and this was followed by two 30 second rinses in hot water. Then the board was dipped in a 25% HCl bath for 30 seconds followed by two distilled water rinses of one minute each. Finally, the board is air dried.

EXAMPLE II

Steps are the same as in Example I except that the PR-491 cleaner solution is substituted for the A-150 cleaner solution. The board is immersed in the PR-491 cleaner solution for 2-5 minutes. The PR-491 cleaner solution is maintained at the ambient temperature.

EXAMPLE III

Steps are the same as in Example I except that the board is placed for 30 seconds in a sodium persulfate solution containing 60 grams per liter of sodium persulfate.

EXAMPLE IV

Steps are the same as in Example I except that the board is placed for 15 seconds in a sodium persulfate solution contining 120 grams per liter of sodium persulfate.

EXAMPLE V

Steps are the same as in Example I except that the board is baked in a vacuum oven at a temperature of about 170° C. for 2 hours.

In using the process of the invention, it has been found that there is a significant increase in the interlaminate bond yields. For example, prior to the implementation of the inventions, certain processes yielded interlaminate bond strengths of between 0 to 3 pounds pull per inch. However, after adding the three-step process, the interlaminate bond yields have increased to upwards of 7 to 8 pounds pull per inch.

While the invention has been described in terms of a preferred embodiment, it will be readily apparent to one skilled in the art that as many modifications and variations can be made therein. It is therefore intended that the invention not be limited to the specifics of the foregoing description, but rather is to embrace the full scope of the following claims.

We claim:

1. A method for treating a circuitized substrate wherein the circuitized substrate is made by additively plating copper on the substrate, to prepare the circuitized substrate for oxidation and subsequent lamination into a multilayer printed circuit board, comprising the steps of:
   dipping the circuitized substrate in an etching bath;
   baking the circuitized substrate at a temperature between 135° C. and 170° C.;
   cleaning the surface of said circuitized substrate with an organic cleaner;
   rinsing said circuitized substrate; and
   drying said circuitized substrate.

2. The invention according to claim 1 wherein said circuitized substrate is baked for 2 to 4 hours.

3. The invention according to claim 1 wherein said etching solution is chosen from the group consisting of cupric chloride, ferric chloride and sodium persulfate.

4. The invention according to claim 1 wherein said etching bath is a solution comprising between 30 grams per liter and 120 grams per liter of sodium persulfate.

5. The invention according to claim 4 wherein said circuitized substrate is dipped in said etching bath for a time between 1 minute and 15 seconds.

6. The invention according to claim 1 wherein said organic cleaner comprises about 15% potassium hydroxide, about 15% propylene glycol, about 55% methyl carbitol and the remainder water.

7. The invention according to claim 6 wherein said circuitized substrate is cleaned by dipping in said organic cleaner for 2 minutes ± 10 seconds.

8. The invention according to claim 1 wherein said organic cleaner comprises about 40% methylene chloride, about 35% wetting agents and the remainder a combination of oxalic acid and methanol.

9. The invention according to claim 8 wherein said circuitized substrate is cleaned by dipping in said organic cleaner for 2-5 minutes.

10. The invention according to claim 1 wherein the step of rinsing said circuitized substrate comprises:
    subjecting said circuitized substrate to 2 consecutive hot water rinses, each lasting about 30 seconds;
    dipping said circuitized substrate in a 25% hydrochloric acid solution for about 30 second; and,
    rinsing said circuitized substrate in 2 consecutive distilled water baths, each lasting about 1 minute.

11. A method for treating a circuitized substrate, wherein said circuitized substrate is made by additively plating copper on the substrate, to prepare the circuitized substrate for oxidation and subsequent lamination into a multilayer printed circuit board, comprising the steps of:
    dipping the circuitized substrate in an etching solution consisting of 30-120 grams per liter of sodium persulfate for a time of 1 minute to 15 seconds;
    baking the circuitized substrate for about 2 hours at a temperature of 135° C. ± 5° C.;
    cleaning the surface of said circuitized substrate with an organic cleaner; and,
    rinsing and drying said circuitized substrate.

* * * * *